(12) United States Patent
Cho et al.

(10) Patent No.: US 9,985,081 B2
(45) Date of Patent: May 29, 2018

(54) ORGANIC LIGHT-EMITTING DISPLAY AND MANUFACTURING METHOD THEREOF

(71) Applicant: Samsung Display Co., Ltd., Yongin-si, Gyeonggi-do (KR)

(72) Inventors: Seunghwan Cho, Yongin-si (KR); Seungmin Lee, Yongin-si (KR); Sangho Park, Yongin-si (KR); Donghwan Shim, Yongin-si (KR); Suyeon Sim, Yongin-si (KR); Joosun Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/153,512

(22) Filed: May 12, 2016

(65) Prior Publication Data
US 2017/0141172 A1    May 18, 2017

(30) Foreign Application Priority Data
Nov. 12, 2015   (KR) .......................... 10-2015-0159001

(51) Int. Cl.
*H01L 27/32* (2006.01)
*H01L 51/56* (2006.01)
*H01L 27/12* (2006.01)

(52) U.S. Cl.
CPC ...... *H01L 27/3262* (2013.01); *H01L 27/3246* (2013.01); *H01L 27/3248* (2013.01); *H01L 27/3258* (2013.01); *H01L 27/3265* (2013.01); *H01L 27/3276* (2013.01); *H01L 51/56* (2013.01); *H01L 27/124* (2013.01); *H01L 27/1248* (2013.01); *H01L 27/1255* (2013.01); (Continued)

(58) Field of Classification Search
CPC ....................... H01L 27/1248; H01L 27/1259
See application file for complete search history.

(56) References Cited

U.S. PATENT DOCUMENTS

2010/0176717 A1*   7/2010   Lee .................... H01L 51/5271
                                                              313/504
2012/0049169 A1    3/2012   Kim
(Continued)

FOREIGN PATENT DOCUMENTS

| KR | 10-2005-0070770 A | 7/2005 |
|----|-------------------|--------|
| KR | 10-2007-0076842 A | 7/2007 |
| KR | 10-2012-0019024 A | 3/2012 |

*Primary Examiner* — Mounir Amer
(74) *Attorney, Agent, or Firm* — H.C. Park & Associates, PLC

(57) ABSTRACT

An organic light-emitting display that includes a substrate comprising a pixel area, a thin film transistor arranged within the pixel area, a wiring electrically connected to the a thin film transistor, an insulating layer covering the thin film transistor and the wiring, a pixel electrode arranged over the insulating layer, a pixel-defining layer having an opening that exposes the pixel electrode, an opposite electrode facing the pixel electrode and an organic emission layer interposed between the pixel electrode and the opposite electrode, the insulating layer having a first region that is overlapped by the pixel electrode and a second region that is not overlapped by the pixel electrode, the second region being thicker than the first region to reduce parasitic capacitance between the opposite electrode and the wiring.

12 Claims, 10 Drawing Sheets

(52) U.S. Cl.
CPC .... *H01L 27/1259* (2013.01); *H01L 2227/323* (2013.01)

(56) References Cited

U.S. PATENT DOCUMENTS

| | | | |
|---|---|---|---|
| 2012/0169217 A1* | 7/2012 | Kim | H01L 27/3246 313/504 |
| 2012/0175649 A1* | 7/2012 | Hong | H01L 27/1255 257/89 |
| 2014/0183537 A1 | 7/2014 | Jang | |
| 2014/0292622 A1* | 10/2014 | Lee | G09G 3/3233 345/80 |

\* cited by examiner

ORGANIC LIGHT-EMITTING DISPLAY AND MANUFACTURING METHOD THEREOF

CLAIM OF PRIORITY

This application makes reference to, incorporates the same herein, and claims all benefits accruing under 35 U.S.C. § 119 from an application for ORGANIC LIGHT-EMITTING DISPLAY AND MANUFACTURING METHOD THEREOF earlier filed in the Korean Intellectual Property Office on Nov. 12, 2015 and there duly assigned Serial No. 10-2015-0159001.

BACKGROUND OF THE INVENTION

Field of the Invention

One or more exemplary embodiments relate to an organic light-emitting display and a manufacturing method thereof.

Description of the Related Art

An organic light-emitting display is a display device in which each of pixels has an organic light-emitting diode (OLED). The OLED includes a pixel electrode, an opposite electrode, and an emission layer disposed between the pixel electrode and the opposite electrode. In the case of the organic light-emitting display, pixel electrodes have an island shape pattern in each pixel, while the opposite electrode has an integral shape over a plurality of pixels. However, in an organic light-emitting display, a parasitic capacitance that reduces image quality occurs between a wiring provided to each pixel and the opposite electrode.

SUMMARY OF THE INVENTION

One or more exemplary embodiments include an organic light-emitting display and a manufacturing method thereof that has a structure capable of preventing a parasitic capacitance between wiring and an opposite electrode and preventing reduction in image quality due to the parasitic capacitance. However, this object is exemplary and the scope of the inventive concept is not limited by this.

Additional aspects will be set forth in part in the description which follows and, in part, will be apparent from the description, or may be learned by practice of the presented embodiments.

According to one aspect of the present invention, there is provided an organic light-emitting display that includes a substrate comprising a pixel area, a thin film transistor arranged within the pixel area of the substrate, a wiring electrically connected to the a thin film transistor, an insulating layer covering the thin film transistor and the wiring, a pixel electrode arranged over the insulating layer and electrically connected to the thin film transistor, a pixel-defining layer having an opening that exposes the pixel electrode, an inner side facing the opening, and an outer side arranged on an opposite side from the inner side and covering an edge of the pixel electrode, an opposite electrode facing the pixel electrode and an organic emission layer interposed between the pixel electrode and the opposite electrode, wherein the insulating layer includes a first region that is overlapped by the pixel electrode and a second region that is not overlapped by the pixel electrode, the second region being thicker than the first region.

At least a part of the wiring may overlap the second region of the insulating layer. The second region of the insulating layer may include a protrusion configured to protrude toward the opposite electrode. An inclined surface of the protrusion may extend towards the edge of the pixel electrode. The protrusion may form an integral part with the insulating layer and include a same material as the insulating layer. The thin film transistor may include an active layer, a gate electrode, a source electrode, and a drain electrode, the wiring may be arranged within a layer between the gate electrode and the pixel electrode. An upper surface of the wiring may directly contact the insulating layer.

The organic light-emitting display may also include a storage capacitor, the thin film transistor may include a driving thin film transistor and a switching thin film transistor, the storage capacitor may be electrically connected to the driving thin film transistor and the switching thin film transistor, the wiring may be one of a data line, a driving voltage line, and a connection line, the connection line may be configured to connect the switching thin film transistor to the storage capacitor. The organic light-emitting display may also include a cavity interposed between the edge of the pixel electrode and one edge of the pixel-defining layer that covers the edge of the pixel electrode.

According to another aspect of the present invention, there is provided a method of manufacturing an organic light-emitting display, including forming a driving thin film transistor, a switching thin film transistor, and a wiring in a pixel area on a substrate, forming an insulating layer comprising a first region having a first thickness and a second region having a second thickness greater than the first thickness, the insulating layer being configured to cover the thin film transistors and the wiring, forming a conductive material layer on the insulating layer, forming a first insulating pattern layer on the conductive material layer, the first insulating pattern layer overlapping the first region of the insulating layer, forming the pixel electrode by patterning the conductive material layer by using the first insulating pattern layer as a mask, forming a second insulating pattern layer on the pixel electrode and corresponding to an edge portion of the pixel electrode, forming a pixel-defining layer configured to cover an edge of the pixel electrode by reflowing the second insulating pattern layer, forming an organic emission layer on the pixel electrode and forming an opposite electrode on the organic emission layer.

The first insulating pattern layer may include a first region and a second region that is thicker than the first region. The second insulating pattern layer may include an opening that corresponds to the first region of the first insulating pattern layer. The second insulating pattern layer may be formed by removing a portion of the first insulating pattern layer. The second insulating pattern layer may be formed by ashing or developing the portion of the first insulating pattern layer. The method may also include reducing a thickness of the second region of the insulating layer from a second thickness to a third thickness by removing an upper portion of the second region of the insulating layer. The removing of the upper portion of the second region of the insulating layer may be performed simultaneous to the forming the second insulating pattern layer. The method may also include forming a protrusion which has an inclined surface in the second region of the insulating layer by performing a reflow process. The forming of the pixel-defining layer may occur simultaneously and from a same reflow process as the forming of the protrusion. The inclined surfaces may extend toward the edge of the pixel electrode. The method may also include forming a storage capacitor electrically connected to the driving thin film transistor and the switching thin film transistor, the wiring may include at least one of a data line, a driving voltage line, and a connection line, the connection line may be configured to connect the switching thin film transistor to the storage capacitor.

BRIEF DESCRIPTION OF THE DRAWINGS

A more complete appreciation of the invention, and many of the attendant advantage thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
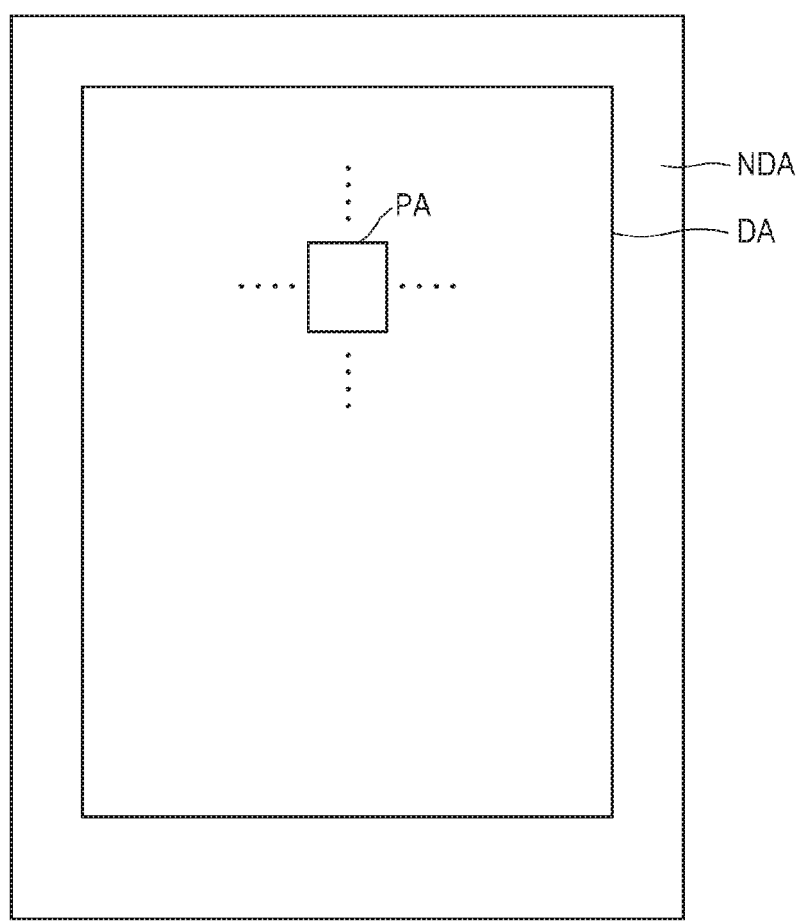
FIG. 1 is a plan view illustrating an organic light-emitting display according to an embodiment.

As the inventive concept allows for various changes and numerous embodiments, exemplary embodiments will be illustrated in the drawings and described in detail in the written description. Effects and characteristics of present exemplary embodiments, and a method of accomplishing them will be apparent by referring to content described below in detail together with the drawings. However, the present exemplary embodiments are not limited to exemplary embodiments below and may be implemented in various forms.

Hereinafter, the inventive concept will be described more fully with reference to the accompanying drawings, in which exemplary embodiments of the inventive concept are shown. When description is made with reference to the drawings, like reference numerals in the drawings denote like or corresponding elements, and repeated description thereof will be omitted.

As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Turning now to FIG. 1, FIG. 1 is a plan view illustrating an organic light-emitting display according to an embodiment. In FIG. 1, the organic light-emitting display includes a display area DA and a non display area NDA neighboring and/or surrounding the display area DA. The display area DA includes a plurality of pixel areas PA, wherein a pixel that can emit visible light being arranged within each pixel area PA. An image is formed via light emitted by the plurality of pixels of the display area DA. Though FIG. 1 illustrates the case where the non display area NDA surrounds the display area DA, the present invention is not limited thereto as the non display area NDA may instead be arranged on one side of the display area DA and can be referred to as a dead area.

Figure 2:
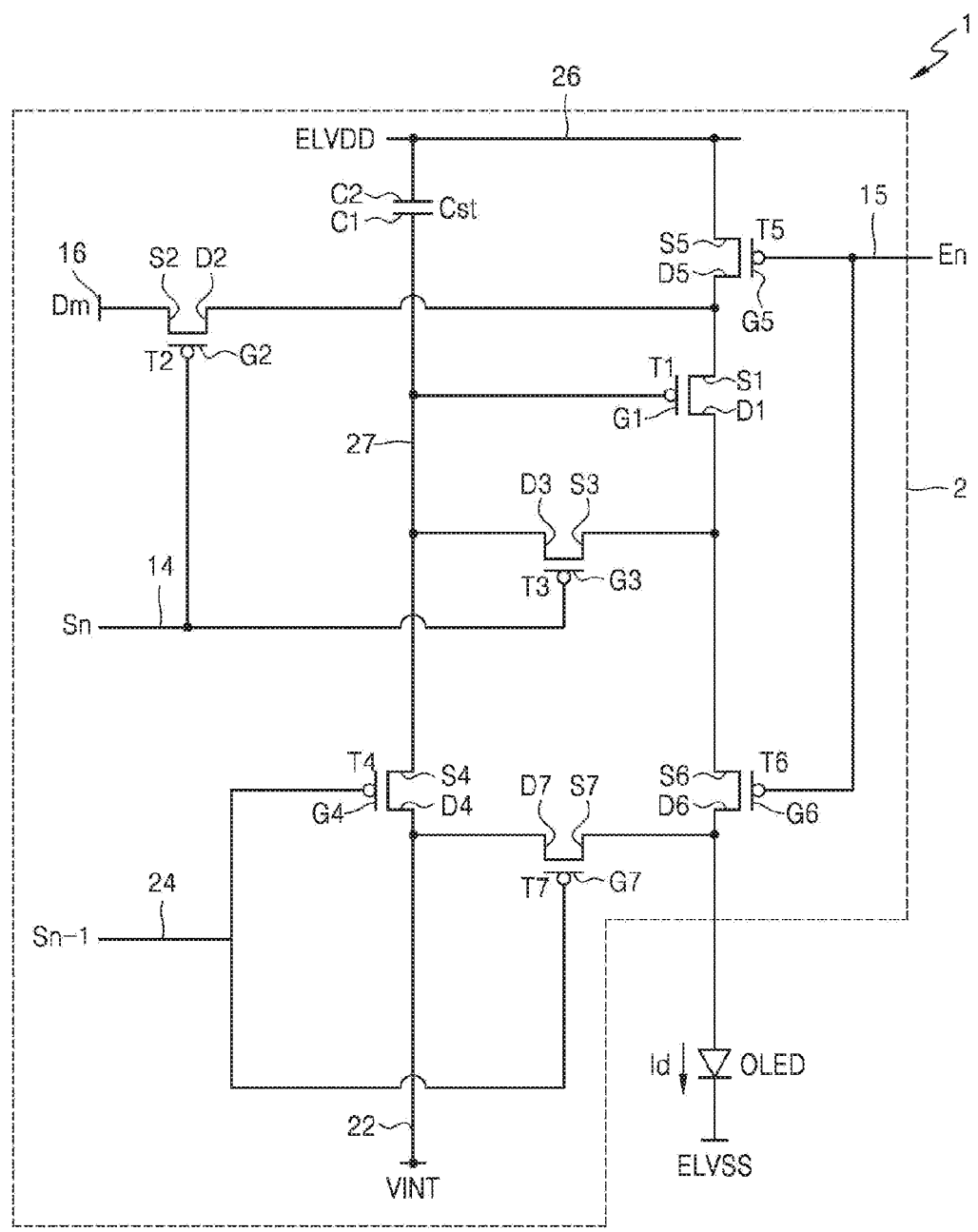
FIG. 2 illustrates an equivalent circuit diagram of a pixel of a pixel area of an organic light-emitting display according to an embodiment.

Turning now to FIG. 2, FIG. 2 is an equivalent circuit diagram illustrating a pixel 1 arranged within a pixel area PA of an organic light-emitting display according to an embodiment. Pixel 1 within pixel area PA includes a pixel circuit 2 and an organic light-emitting diode (OLED) emitting light by receiving a driving current Id from the pixel circuit 2. The pixel circuit 2 may include a plurality of thin film transistors T1 to T7 and a storage capacitor Cst.

According to an embodiment, the plurality of thin film transistors T1 to T7 may include a driving thin film transistor T1 and switching thin film transistors T2 to T7. The switching thin film transistors T2 to T7 may include, for example, a data transfer thin film transistor T2, a compensation thin film transistor T3, a first initialization thin film transistor T4, a first emission control thin film transistor T5, a second emission control thin film transistor T6, and a second initialization thin film transistor T7.

The pixel circuit 2 may include a first scan line 14 transferring a first scan signal Sn to the data transfer thin film transistor T2 and the compensation thin film transistor T3, a second scan line 24 transferring a second scan signal Sn-1 to the first initialization thin film transistor T4 and the second initialization thin film transistor T7, an emission control line 15 transferring an emission control signal En to the first emission control thin film transistor T5 and the second emission control thin film transistor T6, a data line 16 transferring a data signal Dm to the driving thin film transistor T1 by way of the data transfer thin film transistor T2, a driving voltage line 26 transferring a first power voltage ELVDD to second electrode C2 of storage capacitor Cst and to driving thin film transistor T1 by way of the first emission control thin film transistor T5, and an initialization voltage line 22 transferring an initialization voltage VINT initializing the driving thin film transistor T1.

A gate electrode G1 of the driving thin film transistor T1 is connected to a first electrode C1 of the storage capacitor Cst, and a source electrode S1 of the driving thin film transistor T1 is connected to the driving voltage line 26 by way of the first emission control thin film transistor T5. A drain electrode D1 of the driving thin film transistor T1 is electrically connected to a pixel electrode of the OLED by way of the second emission control thin film transistor T6. The driving thin film transistor T1 receives a data signal Dm depending on a switching operation of the data transfer thin film transistor T2 and supplies a driving current Id to the OLED.

A gate electrode G2 of the data transfer thin film transistor T2 is connected to the first scan line 14, and a source electrode S2 of the data transfer thin film transistor T2 is connected to the data line 16. The data transfer thin film transistor T2 performs a switching operation of transferring the data signal Dm transferred to the data line 16 to the source electrode S1 of the driving thin film transistor T1 by being turned on depending on the first scan signal Sn received via the first scan line 14.

A gate electrode G3 of the compensation thin film transistor T3 is connected to the first scan line 14. A source electrode S3 of the compensation thin film transistor T3 is connected to the drain electrode D1 of the driving thin film transistor T1 and connected to the pixel electrode of the OLED by way of the second emission control thin film transistor T6. A drain electrode D3 of the compensation thin film transistor T3 is connected to each of the first electrode C1 of the storage capacitor Cst, a source electrode S4 of the first initialization thin film transistor T4, and the gate electrode G1 of the driving thin film transistor T1. The compensation thin film transistor T3 is turned on depending on the first scan signal Sn transferred via the first scan line 14 so that the driving thin film transistor T1 can be diode-connected.

A gate electrode G4 of the first initialization thin film transistor T4 is connected to the second scan line 24. A drain electrode D4 of the first initialization thin film transistor T4 is connected to the initialization voltage line 22. A source electrode S4 of the first initialization thin film transistor T4 is connected to each of the first electrode C1 of the storage capacitor Cst, the drain electrode D3 of the compensation thin film transistor T3, and the gate electrode G1 of the driving thin film transistor T1. The first initialization thin film transistor T4 performs an initialization operation of transferring an initialization voltage VINT to the gate electrode G1 of the driving thin film transistor T1 and thus initializing a voltage of the gate electrode G1 of the driving thin film transistor T1 by being turned on depending on the second scan signal Sn-1 transferred via the second scan line 24.

A gate electrode G5 of the first emission control thin film transistor T5 is connected to the emission control line 15. A source electrode S5 of the first emission control thin film transistor T5 is connected to the driving voltage line 26. A drain electrode D5 of the first emission control thin film transistor T5 is connected to the source electrode S1 of the driving thin film transistor T1 and the drain electrode D2 of the data transfer thin film transistor T2.

A gate electrode G6 of the second emission control thin film transistor T6 is connected to the emission control line 15. A source electrode S6 of the second emission control thin film transistor T6 is connected to the drain electrode D1 of the driving thin film transistor T1 and the source electrode S3 of the compensation thin film transistor T3. A drain electrode D6 of the second emission control thin film transistor T6 is connected to the pixel electrode of the OLED. When the first emission control thin film transistor T5 and the second emission control thin film transistor T6 are simultaneously turned on by the emission control signal En transferred via the emission control line 15, the first power voltage ELVDD is transferred to the OLED and the driving current Id flows through the OLED.

A gate electrode G7 of the second initialization thin film transistor T7 is connected to the second scan line 24. A source electrode S7 of the second initialization thin film transistor T7 is connected to the pixel electrode of the OLED. A drain electrode D7 of the second initialization thin film transistor T7 is connected to the initialization voltage line 22. The second initialization thin film transistor T7 is turned on depending on the second scan signal Sn-1 transferred via the second scan line 24 to initialize the pixel electrode of the OLED.

The second electrode C2 of the storage capacitor Cst is connected to the driving voltage line 26. The first electrode C1 of the storage capacitor Cst is connected to each of the driving gate electrode G1 of the driving thin film transistor T1, the compensation drain electrode D3 of the compensation thin film transistor T3, and the first initialization source electrode S4 of the first initialization thin film transistor T4.

An opposite electrode of the OLED is connected to a second power voltage ELVSS. The OLED receives the driving current Id from the driving thin film transistor T1 and emits visible light, thereby displaying an image.

Though an embodiment illustrates the case where seven thin film transistors are provided, the present invention is not limited thereto as other quantities of thin film transistors can be used depending on the design of a pixel circuit.

Figure 3:
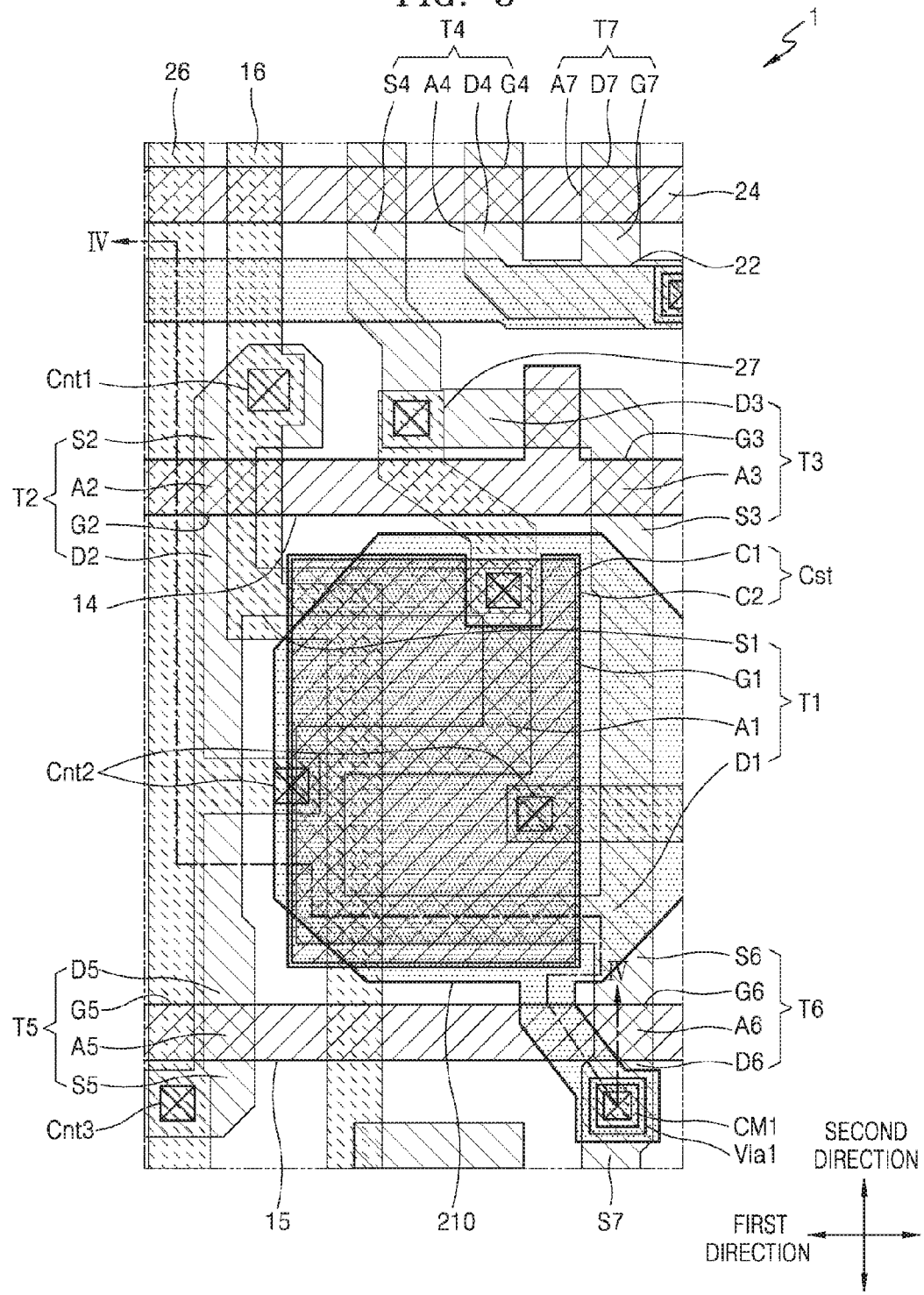
FIG. 3 is a plan view illustrating a pixel within a pixel area of an organic light-emitting display according to an embodiment.
Figure 4:
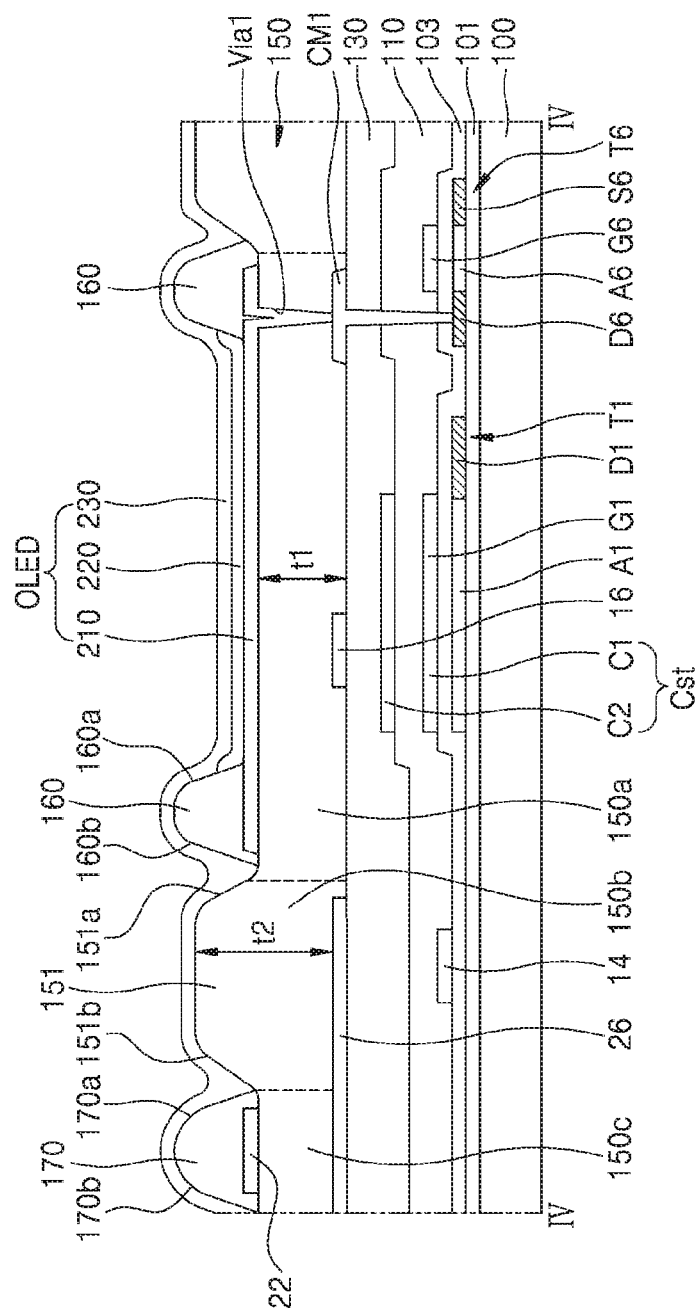
FIG. 4 is a cross-sectional view taken along a line IV-IV of FIG. 3.

Turning now to FIGS. 3 and 4, FIG. 3 is an illustration of a plan view of a pixel 1 within a pixel area PA of an organic light-emitting display according to an embodiment, and FIG. 4 is a cross-sectional view taken along a line IV-IV of FIG. 3. Referring now to FIGS. 3 and 4, the driving thin film transistor T1, the plurality of switching thin film transistors T2 to T7, the storage capacitor Cst, and the OLED described with reference to FIG. 2 are disposed within a pixel area PA. Also, the first scan line 14, the second scan line 24, the emission control line 15, and the initialization voltage line 22 extending along a first direction, and the data line 16 and the driving voltage line 26 extending along a second direction are disposed within the pixel area PA.

Active layers A1 to A7 of the driving thin film transistor T1 and the switching thin film transistors T2 to T7 are formed in the same layer. The active layers A1 to A7 are disposed above the substrate 100 including a buffer layer 101. Each of the active layers A1 to A7 include a source region and a drain region doped with impurities. The source region and the drain region respectively correspond to the source electrodes S1 to S7, and the drain electrodes D1 to D7.

The gate electrode G1 of the driving thin film transistor T1 overlaps a part of the active layer A1 with a gate insulating layer 103 disposed therebetween. The gate insulating layer 103 may include a single layer or a plurality of layers including SiOx (e.g. $SiO_2$) and/or SiNx.

According to an embodiment, the gate electrode G1 of the driving thin film transistor T1 may include a floating electrode. The gate electrode G1 of the driving thin film transistor T1, which is the floating electrode, may be electrically connected to the first initialization thin film transistor T4 by a connection line 27. The gate electrode G1 of the driving thin film transistor T1, the first scan line 14, the second scan line 24, and the emission control line 15 are formed in the same layer.

A part of the first scan line 14 forms the gate electrodes G2 and G3 of the data transfer thin film transistor T2 and the compensation thin film transistor T3. A part of the second scan line 24 forms the gate electrodes G4 and G7 of the first initialization thin film transistor T4 and the second initialization thin film transistor T7. A part of the emission control line 15 forms the gate electrodes G5 and G6 of the first emission control thin film transistor T5 and the second emission control thin film transistor T6.

The first electrode C1 of the storage capacitor Cst is connected to the gate electrode G1 of the driving thin film transistor T1, and the second electrode C2 of the storage capacitor Cst overlaps the first electrode C1 with a first interlayer insulating layer 110 disposed therebetween. The first interlayer insulating layer 110 may include a single layer or a plurality of layers including $SiO_2$ and/or SiNx. The first electrode C1 of the storage capacitor Cst is connected to the first initialization thin film transistor T4 by the connection line 27, and the second electrode C2 of the storage capacitor Cst is connected to the driving voltage line 26.

The storage capacitor Cst may overlap the driving thin film transistor T1. According to an embodiment, the first electrode C1 of the storage capacitor Cst may be integrally formed with the gate electrode G1 of the driving thin film transistor T1. That is, the gate electrode G1 of the driving thin film transistor T1 may perform not only a function of the gate electrode but also a function of the first electrode C1 of the storage capacitor Cst.

Though an exemplary embodiment has described the case where the storage capacitor Cst overlaps the driving thin film transistor T1, the present invention is not limited thereto. According to another embodiment, the storage capacitor Cst may not overlap the driving thin film transistor T1.

The data line 16, the driving voltage line 26, and the connection line 27 may be formed in the same layer, and may be formed above the storage capacitor Cst with a second interlayer insulating layer 130 disposed therebetween. The second interlayer insulating layer 130 may include a single layer or a plurality of layers including SiOx (e.g. $SiO_2$) and/or SiNx. The data line 16 is connected to the data transfer thin film transistor T2 via a first connection part Cnt1, and the driving voltage line 26 is connected to the storage capacitor Cst and the first emission control thin film transistor T5 via a second connection part Cnt2 and a third connection part Cnt3 respectively.

The pixel electrode 210 is formed above the data line 16, the driving voltage line 26, and the connection line 27 with a via insulating layer 150 disposed therebetween. The via insulating layer 150 is disposed right above the data line 16, the driving voltage line 26, and the connection line 27 to contact an upper surface of the data line 16, the driving voltage line 26, and the connection line 27. The via insulating layer 150 may include a photosensitive organic material, such as an olefin-based organic material, or an acryl-based organic material, or an imide-based organic material, etc.

The pixel electrode 210 may be connected to a first connection metal CM1 connected to the drain electrode D6 of the second emission control thin film transistor T6 through a first via hole Via1 formed in the via insulating layer 150. The pixel electrode 210 may be electrically connected to the second emission control thin film transistor T6 by the first connection metal CM1, and may be electrically connected to the driving thin film transistor T1 by way of the second emission control thin film transistor T6.

The pixel electrode 210 may be a (semi) transparent electrode or a reflective electrode. In the case where the pixel electrode 210 is the (semi) transparent electrode, the pixel electrode 210 may include indium tin oxide (ITO), indium zinc oxide (IZO), zinc oxide (ZnO), indium oxide ($In_2O_3$), indium gallium oxide (IGO), or aluminium zinc oxide (AZO). In the case where the pixel electrode 210 is the reflective electrode, the pixel electrode 210 may include a reflective layer including Ag, Mg, Al, Pt, Pd, Au, Ni, Nd, Ir, Cr, or a compound thereof, and a layer located below/above the reflective layer that includes ITO, IZO, ZnO, or $In_2O_3$.

A pixel-defining layer 160 is formed above the pixel electrode 210. The pixel-19 defining layer 160 is disposed along an end (i.e. edge) of the pixel electrode 210 and exposes the pixel electrode 210. A plan view of the pixel-defining layer 160 may have a donut shape or a frame shape. The pixel-defining layer 160 insulates the pixel electrode 210 from the opposite electrode 230 by covering an end of the pixel electrode 210.

The pixel-defining layer 160 includes an inner side 160a extending from an upper surface of the pixel electrode 210 and adjacent to an opening OP (see FIG. 9) exposing the pixel electrode 210, and an outer side 160b located at the opposite side from the inner side 160a and covering an edge of the pixel electrode 210. The inner side 160a and the outer side 160b of the pixel-defining layer 160 may be inclined surfaces. The pixel-defining layer 160 may include a photosensitive organic material, such as an olefin-based organic material, or an acryl-7 based organic material, or an imide-based organic material, etc.

According to an embodiment, the initialization voltage line 22 may be formed in the same layer that the pixel electrode 210 is formed. In the case where the initialization voltage line 22 is formed in the same layer that the pixel electrode 210 is formed, an insulating dam 170 may cover the initialization voltage line 22. The insulating dam 170 is formed in the same layer that the pixel-defining layer 160 is formed, and lateral surfaces 170a and 170b of the insulating dam 170 may be inclined surfaces covering edges of the initialization voltage line 22.

An organic emission layer 220 is disposed above the portion of the pixel electrode 210 exposed by the pixel-defining layer 160, and the opposite electrode 230 is disposed above the organic emission layer 220. The organic emission layer 220 includes a low molecular organic material or a polymer organic material. In addition to the organic emission layer 220, at least one of a hole injection layer, a hole transport layer, an electron transport layer, and an electron injection layer may be further disposed between the pixel electrode 210 and the opposite electrode 230.

The opposite electrode 230 may be integrally formed over a plurality of pixel areas PA and cover the display area DA. The opposite electrode 230 receives the second power voltage ELVSS by contacting a power supply line (not shown) provided to the non display area NDA.

The opposite electrode 230 may be a (semi) transparent electrode or a reflective electrode. In the case where the opposite electrode 230 is the (semi) transparent electrode, the opposite electrode 230 may include a layer including Ag/Mg, Li, Ca, LiF/Ca, LiF/Al, Al, Mg, or a compound thereof, and may further include a layer including a (semi) transparent material such as ITO, IZO, ZnO, or $In_2O_3$, etc. located above this layer. In the case where the opposite electrode 230 is the reflective electrode, the opposite electrode 230 may include a layer including, for example, one or more of Li, Ca, LiF/Ca, LiF/Al, Al, Ag, and Mg. The configuration and material of the opposite electrode 230 are not limited thereto and may include a different material and may have a multi-layered structure, and various changes may be made.

The via insulating layer 150 is disposed above the substrate 100 to cover the entire surface of the substrate 100, and includes a first region 150a overlapped by the pixel electrode 210 and a second region 150b not overlapped by the pixel electrode 210. Since the pixel-16 defining layer 160 is disposed above the first region 150a of the via insulating layer 150 and has a donut shape or a frame shape corresponding to peripheral edges of the pixel electrode 210, a partial region, for example, the second region 150b of the via insulating layer 150 is not overlapped by the pixel-defining layer 160.

The second region 150b of the via insulating layer 150 has a protrusion 151 and lateral (and inclined) surfaces 151a and 151b sloping away from either side of the protrusion. One of the lateral surfaces 151a of the protrusion 151 may extend toward a peripheral edge of the pixel electrode 210. According to an embodiment, one peripheral edge 151a of the protrusion 151 may insulate a peripheral edge of the pixel electrode 210 while contacting the peripheral edge of the pixel electrode 210.

A thickness t2 of the second region 150b having the protrusion 151 is greater than a thickness t1 of the first region 150a. Since the thickness t2 of the second region 150b of the via insulating layer 150 is large, generation of a parasitic capacitance between a part of the opposite electrode 230 disposed above the second region 150b of the via insulating layer 150 and a wiring such as the data line 16, the driving voltage line 26 and/or the connection line 27 disposed below the second region 150b of the via insulating layer 150 is suppressed. Therefore, reduction in image quality due to a parasitic capacitance may be prevented.

In the case where the initialization voltage line 22 is formed in the same layer as the pixel electrode 210, the via insulating layer 150 may further include a third region 150c overlapped by the initialization voltage line 22. A thickness of the third region 150c is substantially the same as the thickness t1 of the first region 150a.

Though FIG. 4 illustrates the case where the opposite electrode 230 and the driving voltage line 26 are disposed above and below the second region 150b of the via insulating layer 150 respectively, the present invention is in no way so limited. Referring to FIG. 4, a part of the via insulating layer 150 covering the entire surface of the substrate 100 that does not overlap the pixel electrode 210 and the initialization voltage line 22 may correspond to the second region 150b. Therefore, not only generation of a parasitic capacitance between the driving voltage line 26 and the opposite electrode 230, but also generation of a parasitic capacitance between the data line 16 and the opposite electrode 230 and/or a parasitic capacitance between the connection line 27 and the opposite electrode 230 may be suppressed.

Although FIGS. 3 and 4 illustrate the case where the pixel electrode 210 overlaps the driving thin film transistor T1 in the pixel area PA, the present invention is not limited thereto. For example, the pixel electrode 210 may be disposed over two pixel areas PA, and the location of the pixel electrode 210 may also change.

Figure 5:
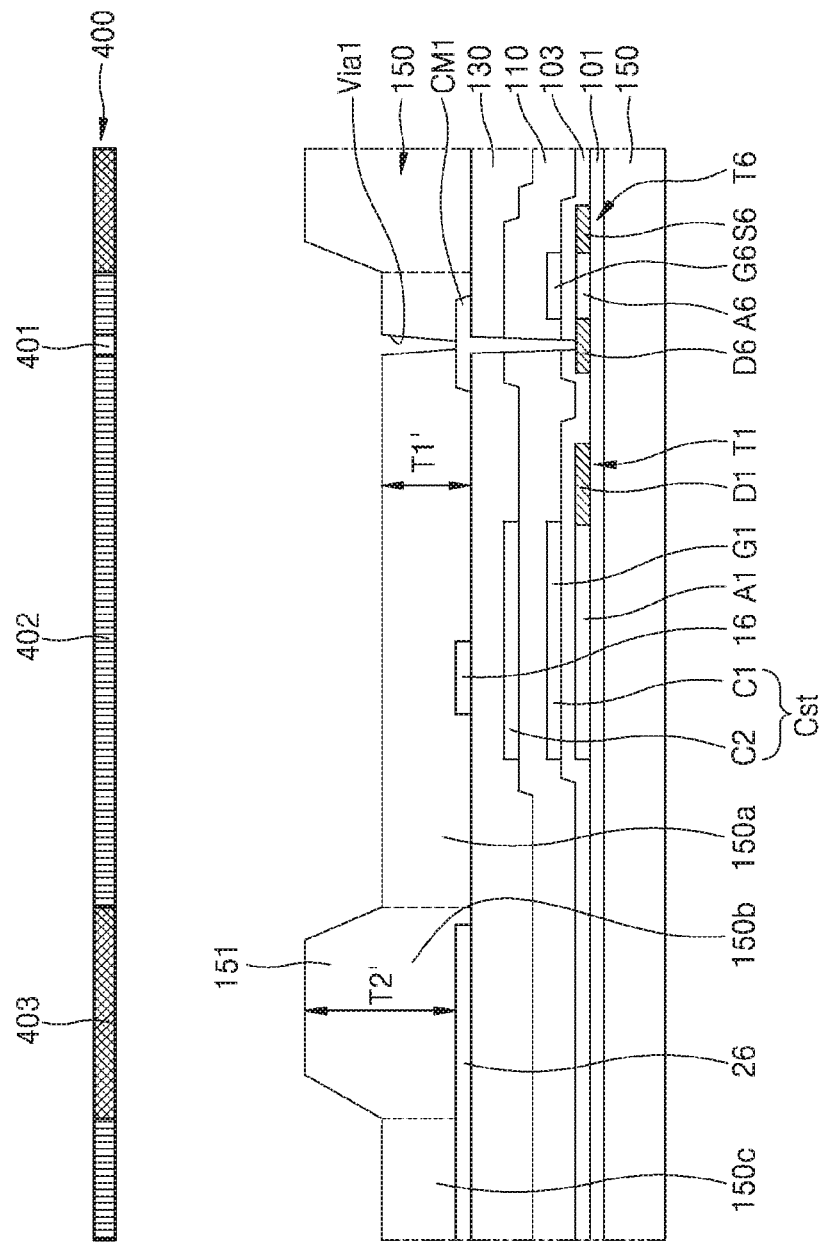
FIG. 5 is a cross-sectional view illustrating a method of manufacturing an organic light-emitting display according to an embodiment where a via insulating layer 150 is exposed and developed.

Turning now to FIGS. 5 to 10, FIGS. 5 to 10 are cross-sectional views illustrating a method of manufacturing an organic light-emitting display of FIG. 4 according to an embodiment of the present invention. Referring now to FIGS. 3 and 5, the driving thin film transistor T1, the switching thin film transistors T2 to T7, the storage capacitor Cst, and the wirings 14, 15, 24, 16, 26, and 27 are formed in the pixel area PA of the substrate 100.

The substrate 100 may include various materials including a plastic material such as poly ethylene terephthalate (PET), poly ethylene naphthalate (PEN), and polyimide. The buffer layer 101 for preventing penetration of impurities into the active layers A1 to A7, the gate insulating layer 103 for insulating the active layers A1 to A7 of the thin film transistors T1 to T7 from the gate electrodes G1 to G7, the first interlayer insulating layer 110 disposed between the first electrode C1 and the second electrode C2 of the storage capacitor Cst, the second interlayer insulating layer 130 covering the second electrode C2 of the storage capacitor Cst, and the via insulating layer 150 covering the data line 16 formed above the second interlayer insulating layer 130, the driving voltage line 26, the connection line 27, and the first connection metal CM1 are formed above the substrate 100.

Though FIG. 5 illustrates the case where the storage capacitor Cst overlaps the driving thin film transistor T1, the present invention is in no way so limited. According to another embodiment, the storage capacitor Cst may instead not overlap the driving thin film transistor T1. For example, in the case where the first electrode C1 and the second electrode C2 of the storage capacitor Cst are formed in the same layers that the active layers A1 to A7 and the gate electrodes G1 to G7 respectively, the second interlayer insulating layer 130 may be omitted.

Next, an insulating material (not shown) including a photosensitive organic material is formed above the entire surface of the substrate 100, and the via insulating layer 150 is formed by using a halftone mask 400. The photosensitive organic material may include an olefin-based organic material, an acryl-based organic material, or an imide-based organic material, etc. According to an embodiment, the via insulating layer 150 may be formed by performing exposure using the halftone mask 400, and developing the exposed photosensitive organic material to remove the exposed region.

The via insulating layer 150 includes a first via hole Via1 exposing the first connection metal CM1, the first region 150a having a first thickness T1', and the second region 150b having a second thickness T2'. An upper part of the second region 150b may form the protrusion 151 by protruding in the thickness direction with respect to the first region 150a.

The via insulating layer 150 may further include the third region 150c having the same thickness as the first thickness T1'. The pixel electrode 210 formed during a process described below is disposed above the first region 150a of the via insulating layer 150, and the initialization voltage line 22 formed during a process described below is disposed above the third region 150c.

A transmission region 401 of the halftone mask 400 may correspond to a first via hole Vial of the via insulating layer 150, a non-transmission region 402 may correspond to the first region 150a and the third region 150c of the via insulating layer 150, and a light-shielding region 403 may correspond to the second region 150b of the via insulating layer 150. Though the embodiment has described the case of using the halftone mask 400, a slit mask may instead be used as understood by a person of ordinary skill in the art.

Figure 6:
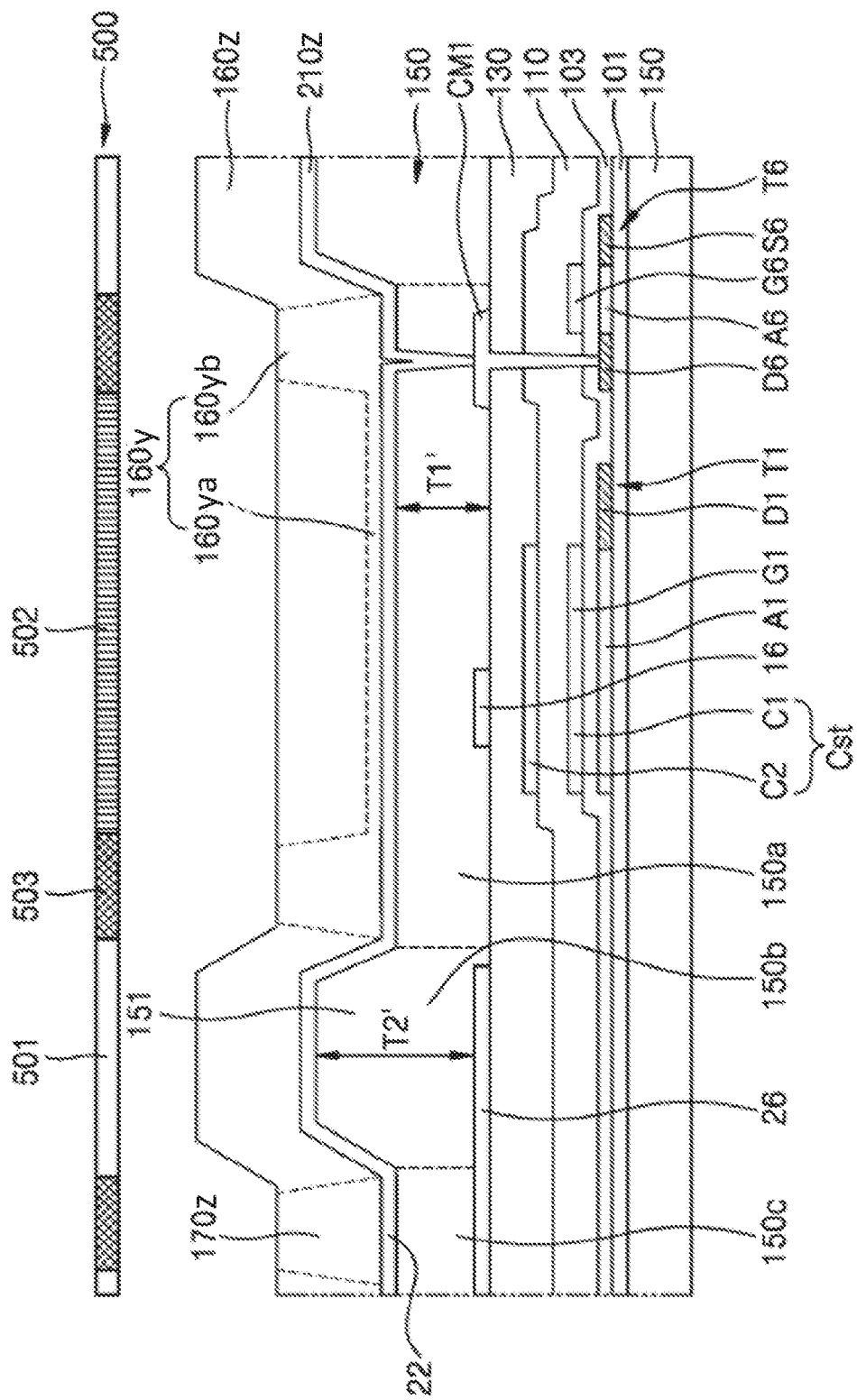
FIG. 6 is a cross-sectional view illustrating a method of manufacturing an organic light-emitting display according to an embodiment where an insulating material layer 160$z$ is exposed.

Referring now to FIGS. 3 and 6, a conductive material layer 210z and an insulating material layer 160z are deposited above the via insulating layer 150. The insulating material layer 160z may include a photosensitive organic material, and the photosensitive organic material may include an olefin-based organic material, an acryl-based organic material, or an imide-based organic material, etc.

After insulating material layer 160z is deposited, a first insulating pattern layer 160y is formed above the conductive material layer 210z by exposing the insulating material layer 160z using a halftone mask 500, and developing to remove the exposed regions. The first insulating pattern layer 160y may be located above the first region 150a of the via insulating layer 150, and include a first part 160ya and a second part 160yb thicker than the first part 160ya, the second part 160yb may surround the first part 160ya. A part of the conductive material layer 210z that is not overlapped by the first insulating pattern layer 160y is exposed to outside.

A transmission region 501 of the halftone mask 500 corresponds to the second region 150b of the via insulating layer 150. A non-transmission region 502 of the halftone mask 500 may correspond to the first part 160ya of the first insulating pattern layer 160y, and a light-4 shielding region 503 may correspond to the second part 160yb of the first insulating pattern layer 160y. Though the embodiment has described the case of using the halftone mask 500, a slit mask may instead be used as understood by a person of ordinary skill in the art.

According to an embodiment, a first insulating dam layer 170z may be formed above the third region 150c of the via insulating layer 150 upon development (i.e. patterning) of the insulating material layer 160z. The first insulating dam layer 170z may correspond to a light-shielding region 503 of the halftone mask 500.

Figure 7:
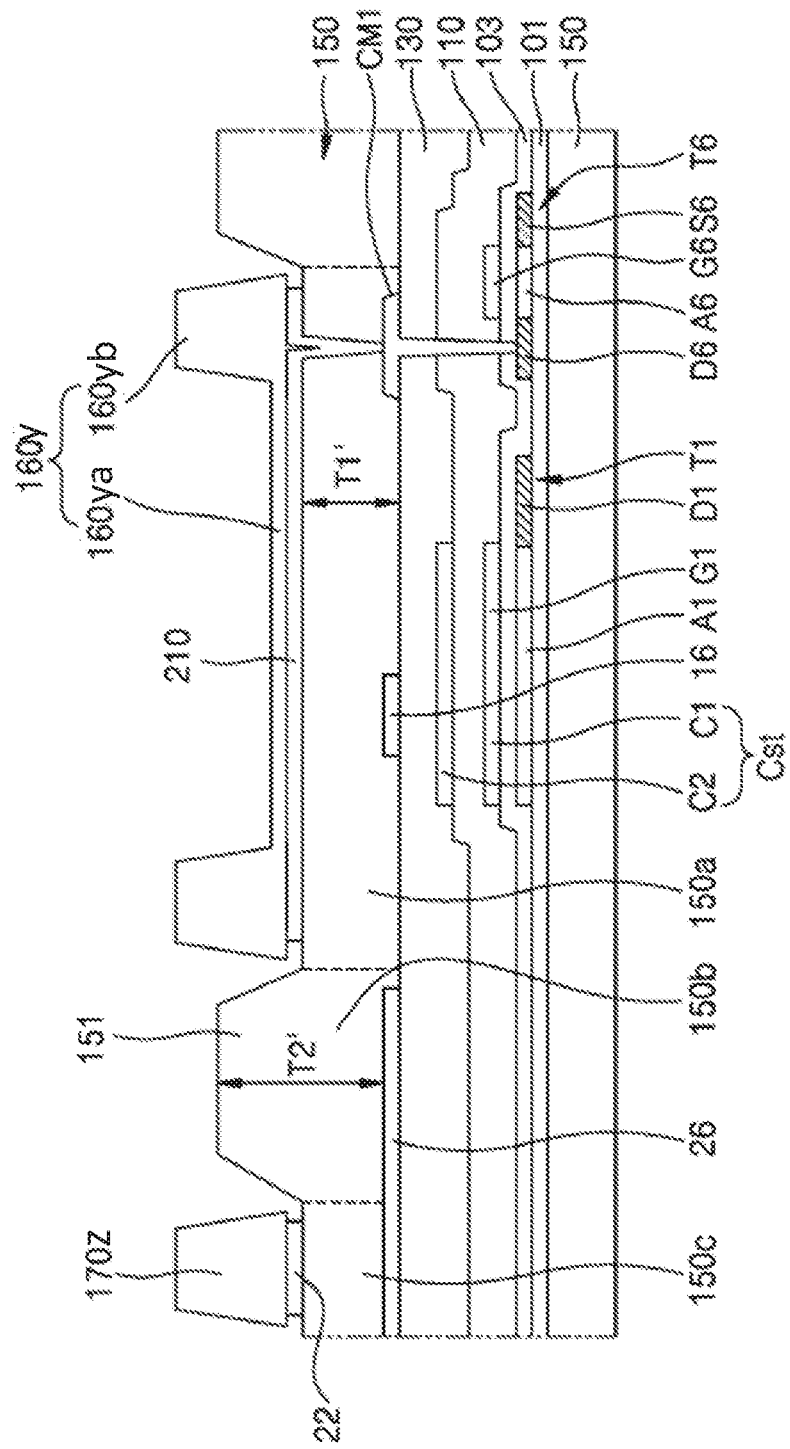
FIG. 7 is a cross-sectional view illustrating a method of manufacturing an organic light-emitting display according to an embodiment where an insulating material layer 160$z$ is developed to produce a first insulating pattern layer 160$y$.

Referring now to FIGS. 3 and 7, the pixel electrode 210 is formed by patterning the conductive material layer 210z using the first insulating pattern layer 160y as an etch mask. According to an embodiment, the conductive material layer 210z may be patterned by a wet etching technique, and the resultant width of the pixel electrode 210 may be smaller than the width of the first insulating pattern layer 160y upon the wet etching process.

According to an embodiment, the initialization voltage line 22 may also be formed during the same process as the patterning of conductive material layer 210z to form pixel electrode 210. In said patterning of conductive material layer 210z to form initialization voltage line 22, first insulating dam layer 170z is used as an etch mask. For example, the initialization voltage line 22 may be formed by wet etching, and the resultant width of the initialization voltage line 22 may be less than the width of the first insulating dam layer 170z.

Figure 8:
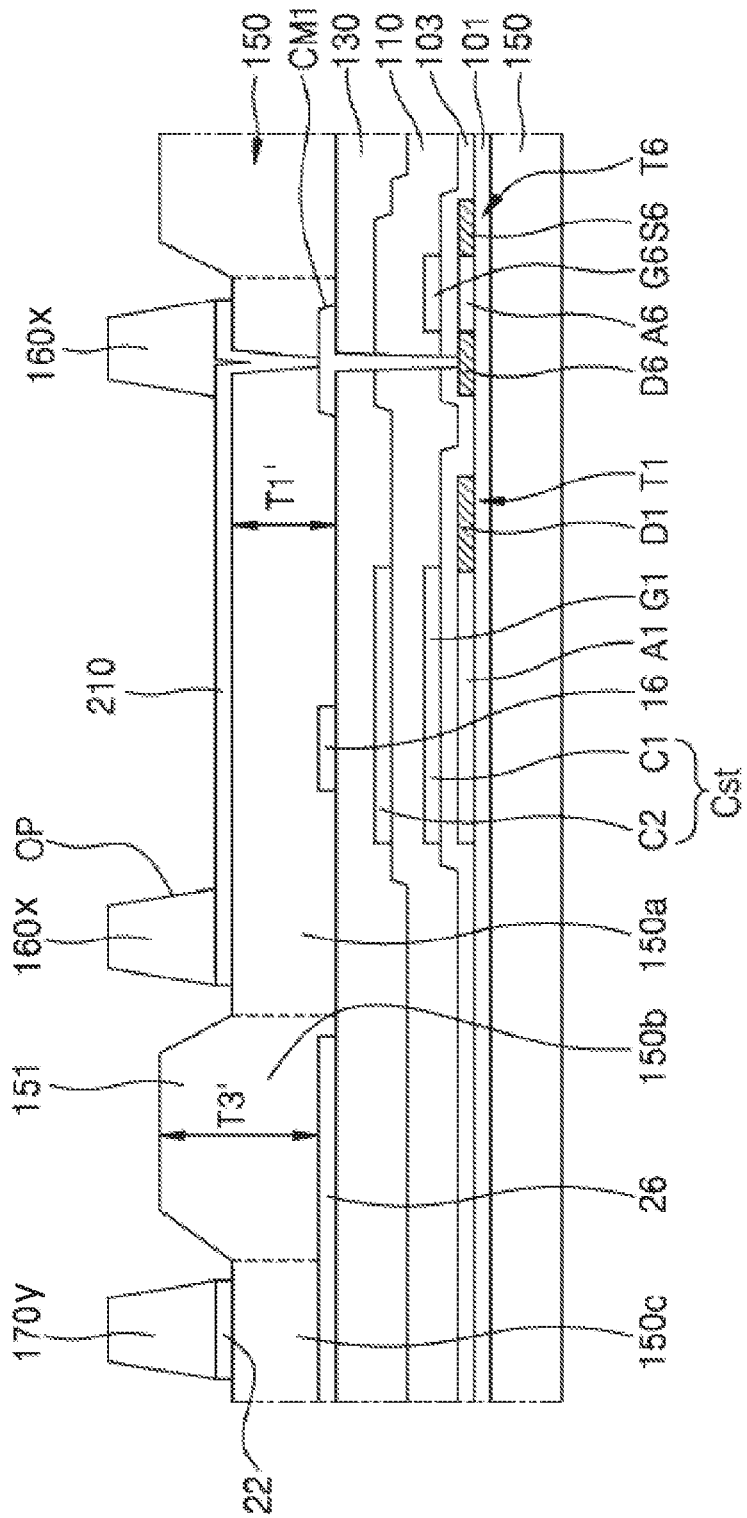
FIG. 8 is a cross-sectional view illustrating a method of manufacturing an organic light-emitting display according to an embodiment where a second insulating pattern layer 160$x$ is produced from the first insulating pattern layer 160$y$ via either an ashing or a developing process.

Referring now to FIGS. 4 and 8, in order to form opening OP to expose the pixel electrode 210, a second insulating pattern layer 160x is formed by removing a part of the first insulating pattern layer 160y. The second insulating pattern layer 160x may be formed by either an ashing technique or a developing technique of the first insulating pattern layer 160y.

The second insulating pattern layer 160x corresponds to the second part 160yb of the first insulating pattern layer 160y. The width and height of the second insulating pattern layer 160x becomes smaller than the width and height of the second part 160yb of the first insulating pattern layer 160y, and the first part 160ya of the first insulating pattern layer 160y is entirely removed by the ashing or developing process to produce the opening OP that exposes a large portion of the pixel electrode 210. The second insulating pattern layer 160x is disposed above the pixel electrode 210 at locations that correspond to ends (i.e. edges) of the pixel electrode 210, and a large portion of an upper surface of the pixel electrode 210 is exposed by the opening OP in the second insulating pattern layer 160x.

During the ashing or developing process used to produce second insulating pattern layer 160x and opening OP, a part of the via insulating layer 150 may also be removed. For example, a region of the via insulating layer 150 that is exposed to an outside (i.e., an upper part of the second region 150b) may be removed during the ashing or developing process of the first insulating pattern layer 160y. Therefore, the height of the protrusion 151 of the via insulating layer 150 is reduced, and the protrusion 151 of the second region 150b of the via insulating layer 150 has a third thickness T3' that is less than the second thickness T2' described with reference to FIG. 5, while the third thickness T3' is still greater than the first thickness T1'.

In addition to producing opening OP and second insulating pattern layer 160x from first insulating pattern layer 160y and in addition to reducing the height of protrusion 151 of second region 150b of via insulating layer 150 from T2' to T3', a part of the first insulating dam layer 170z may be also removed during the ashing or developing process so that a second insulating dam layer 170y of FIG. 8 may be produced. As a result, the width and height of the second insulating dam layer 170y becomes smaller than the width and height of the first insulating dam layer 170z by the ashing or developing process of FIG. 8.

Figure 9:
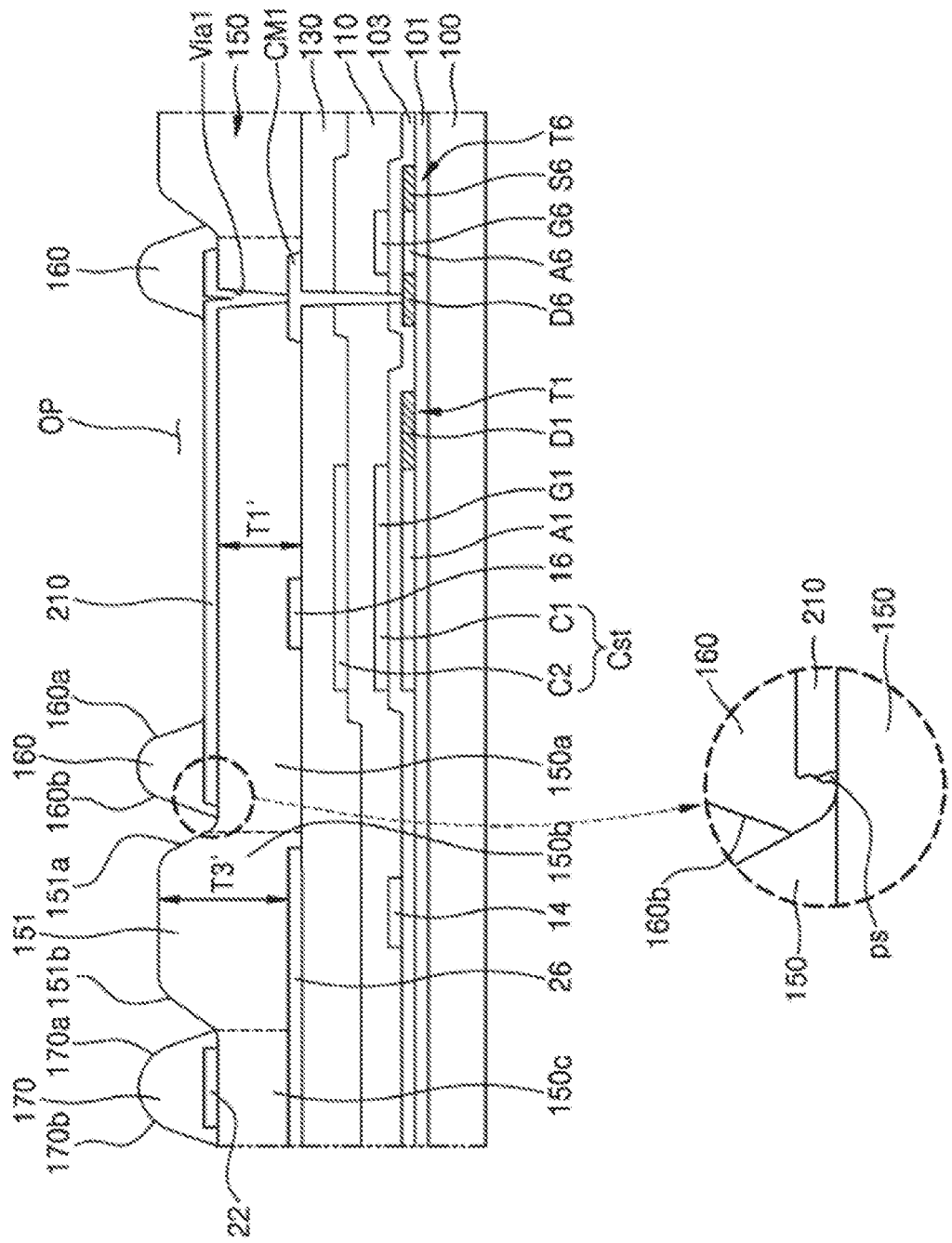
FIG. 9 is a cross-sectional view illustrating a method of manufacturing an organic light-emitting display according to an embodiment where a pixel defining layer 160 is produced from the second insulating pattern layer 160$x$ via a reflow process.

Referring now to FIGS. 3 and 9, the pixel-defining layer 160 covering edges (or ends) of the pixel electrode 210 is formed by performing a reflow process on the second insulating pattern layer 160x. For example, the second insulating pattern layer 160x may flow down during a thermal reflow process and cover the edges of the pixel electrode 210. Both the inner side 160a and the outer side 160b of the pixel-defining layer 160 may have inclined surfaces, and the outer side 160b may cover the edge of the pixel electrode 210.

Referring to enlarged portion of FIG. 9, the pixel-defining layer 160 covers the edge of the pixel electrode 210 upon the reflow process. In this case, a cavity "ps" may be located between the edge of the pixel electrode 210 and one edge of the pixel-defining layer 160 that covers the edge of the pixel electrode 210. According to an embodiment, the edge of the pixel electrode 210 may have an uneven surface as illustrated in the enlarged portion of FIG. 9, said cavity "ps" being produced by the wet etching process used to form the pixel electrode 210 from conductive material layer 210z previously described with reference to FIG. 7. Upon reflow, the pixel-defining layer 160 may cover the edge of the pixel electrode 210 so that the cavity "ps" is covered by and disposed between the pixel-defining layer 160 and the edge of the pixel electrode 210.

During the reflow process, not only is the second insulating pattern layer 160x modified to produce pixel defining layer 160, but also the protrusion 151 of the second region 150b of the via insulating layer 150 is also modified by being flown down toward the edge of the pixel electrode 210, so that the lateral surfaces 151a and 151b of the protrusion 151 may have inclined surfaces. The inclined surface 151a of the protrusion 151 of the via insulating layer 150 may extend toward the edge of the pixel electrode 210. Though not shown, according to an embodiment, one peripheral edge of the protrusion 151 may insulate the edge of the pixel electrode 210 while directly contacting the edge of the pixel electrode 210.

In addition to modifying second insulating pattern layer 160x to produce pixel defining layer 160 and in addition to modifying protrusion 151 of the second region 150b of the via insulating layer 150, the second insulating dam layer 170y is also modified by the reflow process to produce insulating dam 170. For example, the second insulating dam layer 170y may flow down during a thermal reflow process and cover an edges of the initialization voltage line 22, and lateral surfaces 170a and 170b of the insulating dam 170 may become inclined surfaces during the reflow process of FIG. 9.

Figure 10:
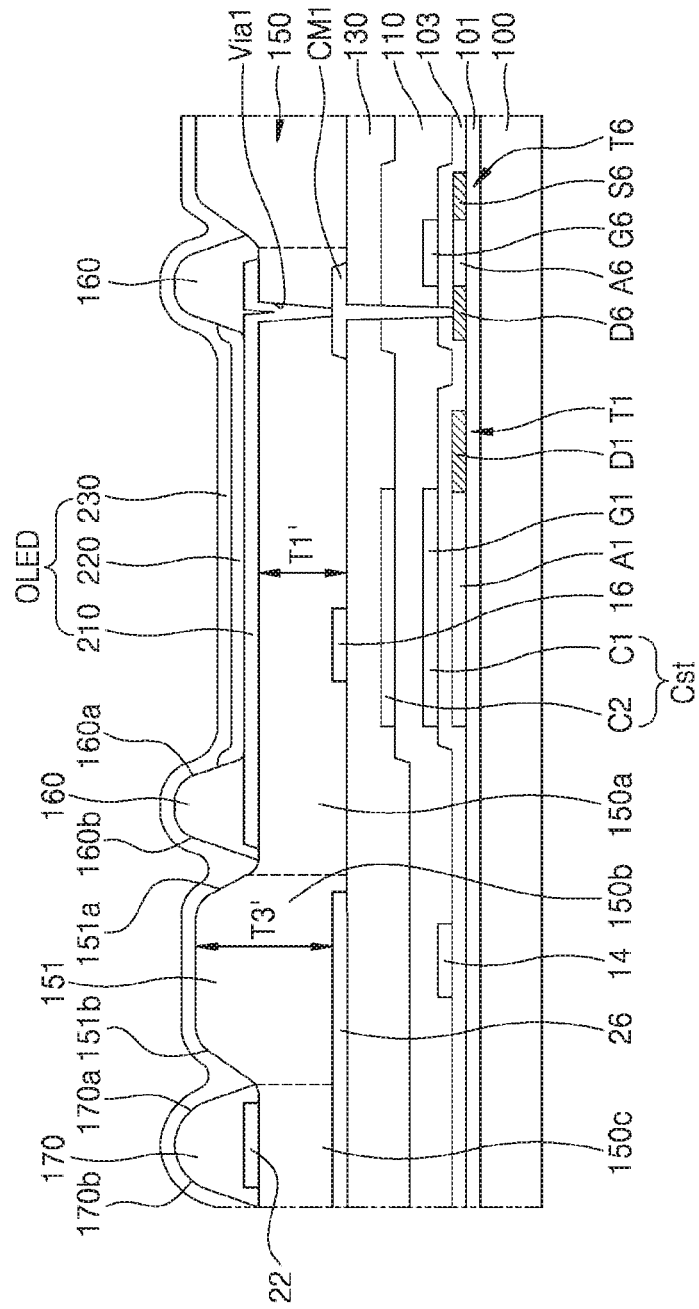
FIG. 10 is a cross-sectional view illustrating a method of manufacturing an organic light-emitting display according to an embodiment where an emission layer 220 and a counter electrode 230 are formed over the structure of FIG. 9.

Referring now to FIGS. 4 and 10, the organic emission layer 220 is formed above the pixel electrode 210, and the opposite electrode 230 is formed above the organic emission layer 220. The organic emission layer 220 may be disposed above the portion of the pixel electrode 210 exposed by the pixel-defining layer 160, and include a low molecular organic material or a polymer organic material. Besides the organic emission layer 220, at least one of a hole injection layer, a hole transport layer, an electron transport layer, and an electron injection layer may be further interposed between the pixel electrode 210 and the opposite electrode 230. The opposite electrode 230 may be integrally formed over the entire surface of the substrate 100. Since the pixel-defining layer 160 covers the edges of the pixel electrode 210, a short circuit between the pixel electrode 210 and the opposite electrode 230 is prevented.

Also, since protrusion 151 of second region 150b of via insulating layer 150 has the third thickness T3', generation of a parasitic capacitance between the wiring disposed below the second region 150b, for example, the data line 16, the driving voltage line 26 and/or the connection line 27, and the opposite electrode 230 disposed above the second region 150b may be suppressed, and thus image quality may be improved. In comparing the arrangements of FIG. 10 with that of FIG. 4, it is to be appreciated that the first thickness T1' of the first region 150a of the via insulating layer 150 illustrated in FIGS. 8 to 10 is equal to the thickness t1 of the first region 150a of the via insulating layer 150 illustrated in FIG. 4, and the third thickness T3' of the second region 150b of the via insulating layer 150 illustrated in FIGS. 8 to 10 is equal to the thickness t2 of the second region 150b of the via insulating layer 150 illustrated in FIG. 4.

According to the above-described embodiment, since the pixel electrode 210 and the pixel-defining layer 160 are both formed by using one halftone mask 500, a number of masks used for a manufacturing process is reduced. Furthermore, since the thicknesses of the first region 150a and the second region 150b of the via insulating layer 150 are different from each other, generation of a parasitic capacitance between the opposite electrode 230 and the wiring (for example, the data line 16, the driving voltage line 26, and the connection line 27) respectively disposed above and below the via insulating layer 150 may be suppressed. Since the exposed part of the via insulating layer 150, that is, the second region 150b is also reduced in size as a result of the ashing or developing process described above, if the protrusion 151 of second portion 150b of via insulating layer 150 has a uniform second thickness T2', the thickness T3' of the protrusion 151 of second region 150b of via insulating layer 150 becomes smaller than the second thickness T2' after the ashing or developing process. However, according to embodiments of the present invention, since the thickness T2' of the second region 150b of the via insulating layer 150 is formed to be significantly larger than the thickness T1' of the first region 150a, the loss in thickness of the protrusion 151 of second region 150b during the ashing process by having thickness T2' be sufficiently large, so that the final thickness T3' of protrusion 151 of second region 150b of via insulating layer 150 still remains thicker than the first thickness T1', so that the generation of a parasitic capacitance can be suppressed and reduction in image quality may be prevented despite the ashing or developing process of FIG. 8.

Though the inventive concept has been described with reference to exemplary embodiments illustrated in the drawings, these are provided for an exemplary purpose only, and one of ordinary skill in the art will understand that various modifications and other equivalent embodiments may be made therein. Therefore, the spirit and scope of the inventive concept should be defined by the following claims.

What is claimed is:

1. An organic light-emitting display device, comprising: a substrate comprising a pixel area; a thin film transistor arranged within the pixel area of the substrate; a wiring electrically connected to the a thin film transistor, an insulating layer covering the thin film transistor and the wiring; a pixel electrode arranged over the insulating layer and electrically connected to the thin film transistor; a pixel-defining layer having an opening that exposes the pixel electrode, an inner side facing the opening, and an outer side arranged on an opposite side from the inner side and covering an edge of the pixel electrode; an opposite electrode facing the pixel electrode; and an organic emission layer interposed between the pixel electrode and the opposite electrode, wherein the insulating layer includes a first region that is overlapped by the pixel electrode and a second region that is not overlapped by the pixel electrode, the second region being thicker than the first region, wherein the first region of the insulating layer overlaps substantially all of the openings of the pixel-defining layer.

2. The device of claim 1, wherein at least a part of the wiring overlaps the second region of the insulating layer.

3. The device of claim 1, wherein the second region of the insulating layer comprises a protrusion configured to protrude toward the opposite electrode.

4. The device of claim 3, wherein an inclined surface of the protrusion extends toward the edge of the pixel electrode.

5. The device of claim 3, wherein the protrusion which is unitary with the insulating layer comprises a same material as the insulating layer.

6. The device of claim 1, wherein the thin film transistor comprises an active layer, a gate electrode, a source electrode, and a drain electrode, the wiring being arranged between the gate electrode and the pixel electrode.

7. The device of claim 6, wherein an upper surface of the wiring directly contacts the insulating layer.

8. The device of claim 1, further comprising a storage capacitor,
   wherein the thin film transistor comprises a driving thin film transistor and a switching thin film transistor, the storage capacitor being electrically connected to the driving thin film transistor and the switching thin film transistor, and
   wherein the wiring comprises at least one of a data line, a driving voltage line, and a connection line, the connection line being configured to connect the switching thin film transistor to the storage capacitor.

9. The device of claim 1, further comprising a cavity interposed between the edge of the pixel electrode and one edge of the pixel-defining layer that covers the edge of the pixel electrode.

10. The device of claim 1, wherein the second region of the insulating layer is disposed between the wiring and the opposite electrode.

11. The device of claim 1, wherein the insulating layer includes olefin-based organic material, an acryl-based organic material, or an imide-based organic material.

12. The device of claim 1, wherein a first distance from the substrate to a top of the second region of the insulating layer is greater than a second distance from the substrate to a top of the pixel electrode.

* * * * *